United States Patent
Ikeda

(10) Patent No.: US 8,854,112 B2
(45) Date of Patent: Oct. 7, 2014

(54) FET DRIVE CIRCUIT AND FET MODULE

(71) Applicant: Kabushiki Kaisha Toshiba, Tokyo (JP)

(72) Inventor: Kentaro Ikeda, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 49 days.

(21) Appl. No.: 13/785,000

(22) Filed: Mar. 5, 2013

(65) Prior Publication Data

US 2013/0249606 A1 Sep. 26, 2013

(30) Foreign Application Priority Data

Mar. 24, 2012 (JP) ................... 2012-068509

(51) Int. Cl.
| | | |
|---|---|---|
| *H03K 17/687* | (2006.01) | |
| *H03K 5/08* | (2006.01) | |
| *H03K 17/16* | (2006.01) | |
| *H03K 17/082* | (2006.01) | |

(52) U.S. Cl.
CPC .......... *H03K 17/161* (2013.01); *H03K 17/0822* (2013.01)
USPC ........... 327/427; 327/434; 327/309; 327/310; 327/321; 327/330; 461/91.5; 461/91.6

(58) Field of Classification Search
None
See application file for complete search history.

(56) References Cited

U.S. PATENT DOCUMENTS

| | | | | |
|---|---|---|---|---|
| 3,571,608 | A | * | 3/1971 | Hurd, III .................... 361/77 |
| 4,178,619 | A | * | 12/1979 | Seiler et al. ................ 361/91.6 |
| 5,115,143 | A | * | 5/1992 | Rohulich et al. .............. 327/109 |
| 5,559,656 | A | * | 9/1996 | Chokhawala ................. 361/18 |
| 6,031,705 | A | * | 2/2000 | Gscheidle .................. 361/111 |
| 6,087,862 | A | * | 7/2000 | Williams ................... 327/108 |
| 6,462,382 | B2 | * | 10/2002 | Yoshida et al. ............. 257/355 |
| 7,460,349 | B2 | * | 12/2008 | Fichera .................... 361/93.1 |
| 2011/0215840 | A1 | * | 9/2011 | Machida ................... 327/109 |
| 2013/0063852 | A1 | * | 3/2013 | Lin ........................ 361/91.5 |

FOREIGN PATENT DOCUMENTS

JP 2011-211096 10/2011

* cited by examiner

*Primary Examiner* — Tuan T Lam
(74) *Attorney, Agent, or Firm* — Oblon, Spivak, McClelland, Maier & Neustadt, L.L.P.

(57) ABSTRACT

According to an embodiment, an FET drive circuit includes an FET, a first circuit, a resistor and a third rectifying device. The first circuit includes a first rectifying device, a second rectifying device and a capacitive element sequentially provided in series from a drain to a gate of the FET, the first rectifying device allowing a forward electric current flowing from the drain to the gate, and the second rectifying device having a predetermined breakdown voltage with respect to the electric current from the drain to the gate. The resistor is provided between a power source and a connecting point of the second rectifying device and the capacitive element; and the third rectifying device provided between a source and a gate of the FET.

20 Claims, 3 Drawing Sheets

FET DRIVE CIRCUIT AND FET MODULE

CROSS-REFERENCE TO RELATED APPLICATIONS

This application is based upon and claims the benefit of priority from Japanese Patent Application No. 2012-068509, filed on Mar. 24, 2012; the entire contents of which are incorporated herein by reference.

FIELD

Embodiments are generally related to a FET drive circuit and a FET module.

BACKGROUND

Semiconductor devices made of a nitride semiconductor such as GaN, or a wide-gap semiconductor such as SiC, diamond and ZnO provide a higher breakdown voltage, lower resistance and a higher-speed operation in comparison with the silicon devices. Particularly, GaN or InAlN-type FETs (Field Effect Transistors) so called HEMTs (High Electron Mobility Transistors) and diodes have a hetero-structure, and may include an electron channel with two-dimensionally electron gas (hereinafter, 2DEG) at the hetero-interface. The high electron mobility and high electron density in the 2DEG channel may realize the FETs with the low-resistance and high-speed operation. In other words, it is possible to make a device with a smaller area and a smaller parasitic capacitance than the silicon device, which is conventionally used for power control, and thus to increase the operation speed.

However, p-type semiconductors cannot be easily and flexibly formed in GaN or InAlN-type nitride semiconductors. In addition, the tolerance for the avalanche breakdown is small, when the large transitional voltage is applied. For this reason, the nitride semiconductors adversely affect a circuit design. Concretely, when a voltage more than a rated voltage of FET such as a surge voltage is applied even only for a second, the FET is sometimes broken. Therefore, the nitride semiconductors have room for improvement, in contrast to the silicon FETs that are not immediately broken due to their approximately high avalanche resistance.

DETAILED DESCRIPTION

Figure 1:
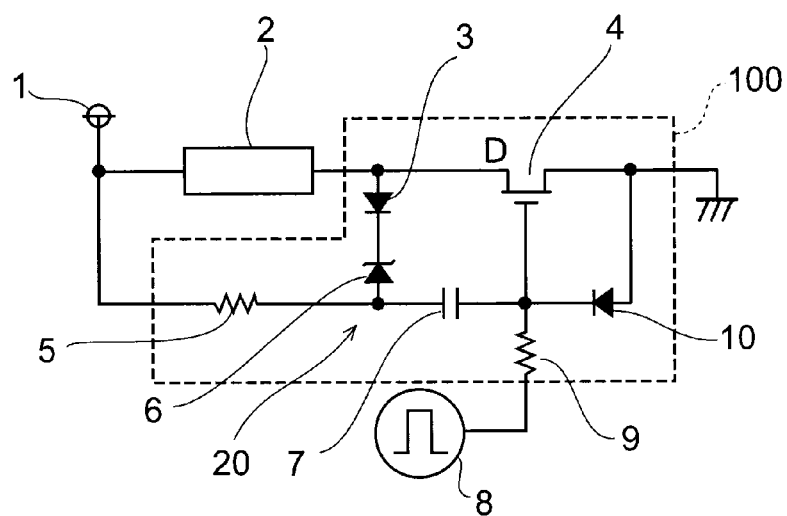
FIG. 1 is a schematic view illustrating an FET drive circuit according to a first embodiment.

According to an embodiment, an FET drive circuit includes an FET, a first circuit, a resistor and a third rectifying device. The first circuit includes a first rectifying device, a second rectifying device and a capacitive element sequentially provided in series from a drain to a gate of the FET, the first rectifying device allowing a forward electric current flowing from the drain to the gate, and the second rectifying device having a predetermined breakdown voltage with respect to the electric current from the drain to the gate. The resistor is provided between a power source and a connecting point of the second rectifying device and the capacitive element; and the third rectifying device provided between a source and a gate of the FET.

An embodiment will be described below with reference to drawings. Like components in the drawings are denoted by like reference symbols, and description thereof is appropriately omitted.

First Embodiment

FIG. 1 is a schematic view showing an FET drive circuit according to a first embodiment.

The FET drive circuit 100 includes an FET 4, a first circuit 20, a resistor 5, and a third rectifying device 10. The first circuit 20 includes a first rectifying device 3, a second rectifying device 6 and a capacitive element 7 that are provided in series between a drain and a gate of the FET 4. One end of the resistor 5 is connected to a connecting point between the second rectifying device 6 and the capacitive element 7, and the other end of the resistor 5 is connected to a power supply 1. The third rectifying device 10 is provided between a source and a gate of the FET 4. The first rectifying device 3 allows a forward electric current flowing from the drain to the gate of the FET 4. The second rectifying device has characteristic that a predetermined breakdown voltage with respect to the electric current flowing from the drain to the gate of the FET 4.

The FET 4 performs a switching operation. The first rectifying device (diode) 3 causes a surge voltage to pass therethrough. The second rectifying device (zener diode) 6 adjusts a surge detecting voltage. The capacitive element (the capacitor) 7 transmits a surge voltage to the gate. The resistor 5 maintains a voltage of the capacitor 7 constant during the normal operation. The third rectifying device (diode) 10 protects the gate of the FET 4. In the specific example, the FET 4 is of a normally off type.

A switching main circuit includes a load 2. One end of the load 2 is connected to the power supply 1, and the other end of the load 2 is connected to the drain of the FET 4. Further, the gate of the FET 4 is connected to a signal source 8 via a resistor 9, and a gate control signal is supplied to the gate. In the specific example shown in FIG. 1, for convenience of description, the source of the FET 4 is grounded, but actually does not have to be grounded.

The diode 3, the zener diode 6 and the diode 10 may have a very small rated current with respect to the FET 4. Design values of the rated currents, concretely, vary according to current capacity of the switching main circuit and input capacity of the FET 4, but may be not more than 1/10 of the rated current of the FET 4. Since voltages are applied to both ends of the diode 3 by approximately a power-supply voltage, a breakdown voltage should be larger than a power-supply voltage 1. A value of the resistor 5 may be determined by an experiment because it has a close relation to the design values of the other sections, but the value may be set to not less than 100 Ω.

When a surge voltage is not applied, a high-voltage part of the capacitor 7 is maintained at the power-supply voltage throughout the resistor 5. When a drain voltage changes, a mirror effect is easily induced, reducing a switching operation speed of the FET. On the contrary, an additional mirror effect is not produced in the embodiment, because a voltage of the capacitor 7 is maintained to be constant.

The capacitor 7 is connected to the power supply 1 via the resistor 5 having large impedance. Further, the capacitor 7 is also connected to series capacitors of the diode 3 and the zener diode 6 that have small parasitic capacitances respectively. That is to say, the capacitance of the capacitor 7 is larger than respective parasitic capacitances of the diode 3 and the zener diode 6. Thereby, the impedance of the capacitor 7 viewed from the signal source 8 or a gate resistor 9 is very high. This means that the capacitor 7 does not induce the mirror effect and also can be ignored as parasitic capacitance for the FET 4. For this reason, it is advantageous in the embodiment that a surge suppression circuit added to the FET may induce a negligibly small reduction in the operating speed.

Further, due to the similar reason, there is no risk of self turn-on. Since a reverse bias or a zero bias is applied to the diode 3 in this state, an electric current does not flow therethrough. The zener diode 6 does not affect on the switching operation, while a surge voltage does not applied thereto. The resistor 5 consumes approximately no power, while a surge voltage is applied thereto.

A case where a surge voltage is applied to the drain of the FET 4 will be described below.

The diode 3 is biased to a forward direction, being in a conduction state. Then, a surge voltage is applied to the zener diode 6. When a surge voltage not less than a zener voltage is applied thereto, the zener diode 6 becomes conductive, applying a surge voltage to the capacitor 7. When the surge voltage is applied to the capacitor 7, a gate voltage of the FET 4 rises via the capacitor 7, and thus the FET 4 is in the conduction state. When the FET 4 is conductive, the surge is released to the source of the FET 4 therethrough. Thereby, the FET 4 is prevented from being broken due to the surge voltage.

According to the embodiment, the surge voltage that may turn on the FET 4 can be adjusted to be the zener voltage in the zener diode 6. Hence, it is advantageous that a breakdown voltage of the FET 4 does not have to be excessively increased, and the zener diode 6 may definitely adjusts a voltage reacting to the surge voltage.

When the surge is over, the drain voltage of the FET 4 drops, and thus the gate voltage of the FET 4 via the diode 3, the zener diode 6 and the capacitor 7 also decreases. At this time, the gate might be broken due to an excessive drop of the gate voltage. Thus, the diode 10 is provided in order to protect the gate. That is, an electric current flowing in the forward direction of the diode 10 may suppress the drop of the gate voltage, while the gate voltage of the FET 4 is going to excessively drop.

Figure 2:
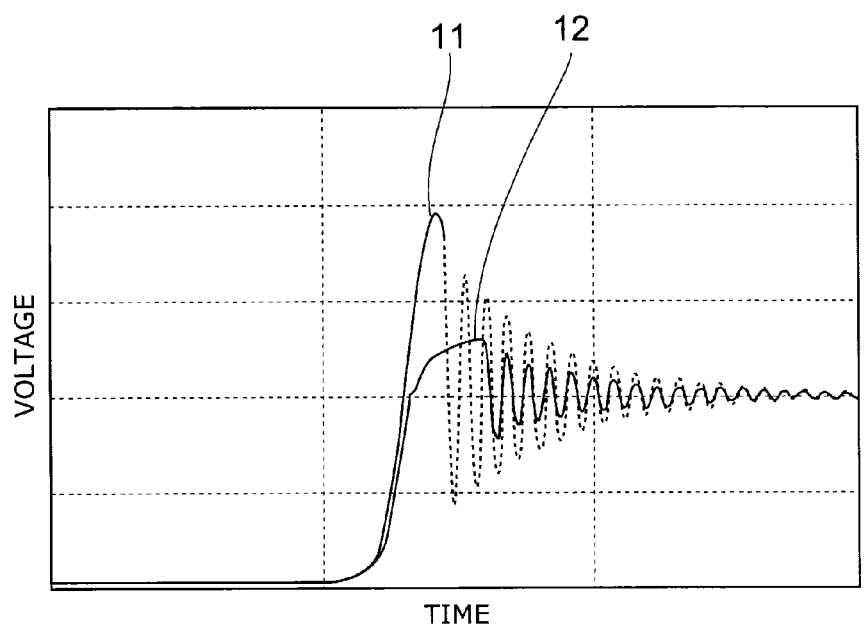
FIG. 2 is a graph illustrating an advantageous effect of the FET drive circuit of the embodiment.

FIG. 2 is a graph illustrating an advantageous effect of the FET drive circuit according to the embodiment. A horizontal axis shows time, and a vertical axis shows a drain voltage in FIG. 2.

A drain voltage 11 shows a case where the FET drive circuit 100 of the embodiment is not provided, and a drain voltage 12 shows a case where the FET drive circuit 100 is provided.

As is clear from FIG. 2, when a surge voltage is applied, a rise in the drain voltage can be repressed to not more than ⅓ of the case not providing the FET drive circuit 100.

As protection of the FET 4 against a surge voltage, some methods for GaN-type FETs are considered, such as a method for designing a large rated voltage of the FET in expectation of a surge voltage, or a method for absorbing a surge voltage in front of a drain terminal of the FET.

However, the increase in the rated voltage of the FET causes negative effects, such as increases in cost, in parasitic capacitance and in parasitic resistor. Any circuit loaded in front of the drain terminal also causes an negative effect such that parasitic capacitance is equivalently increased.

Also a circuit for allowing the FET to be conductive at a time when applying a surge voltage may unintentionally increase the parasitic capacitance between the drain and the gate, and thereby easily induce the mirror effect or a parasitic oscillation due to the self-turn on. Since GaN-type power devices have an advantage of high-speed property, an increase in switching loss caused by an increase in parasitic capacitance is a disturbing effect.

On the contrary, according to the embodiment, it is possible to provide the FET drive circuit suppressing the parasitic capacitance, the parasitic resistance, the mirror effect and the parasitic oscillation with low cost, and being protected against a surge voltage.

In the embodiment, a nitride semiconductor FET can be used as the FET 4. In such an FET, for example, a base layer, a first layer formed on the base layer and a second layer formed on the first layer are provided, and a source electrode, a gate electrode and a drain electrode are provided on the second layer. The gate electrode may be provided on the second layer via a Schottky junction or a gate insulating film formed on the second layer, which has so-called MIS (Metal-Insulator-Semiconductor) structure.

The first layer is composed of a first nitride semiconductor, and serves a carrier transport layer. The second layer is composed of a second nitride semiconductor having a band gap wider than that of the first nitride semiconductor, and serves as a barrier layer.

The "nitride semiconductor" referred to herein includes group III-V compound semiconductors of $B_xIn_yAl_zGa_{1-x-y}N$ ($0 \leq x \leq 1, 0 \leq y \leq 1, 0 \leq z \leq 1, 0 \leq x+y+z \leq 1$), and also includes mixed crystals containing a group V element besides N (nitrogen), such as phosphorus (P) and arsenic (As). Furthermore, the "nitride semiconductor" also includes those further containing various elements added to control various material properties such as conductivity type, and those further containing various unintended elements.

A nitride semiconductor FET easily operates with high breakdown voltage, low resistance, small parasitic capacitance and high speed owing to the physical properties of the nitride semiconductor. Such an FET with high breakdown voltage and the low resistance is going to use in a high-voltage circuit and a large-current circuit, where a risk for applying of a surge voltage is high. Hence, it is desired to provide the surge protection circuit, because of the low avalanche resistance in the nitride semiconductor.

The nitride semiconductor FET is expected to have small parasitic capacitance and operate with a high speed. Thus, it is favorable for the nitride semiconductor FET to have the advantage based on the embodiment, suppressing the surge effect without slowing down the FET operation. Further, it is also advantageous for the nitride semiconductor FET to sufficiently raise the gate voltage in a case where the capacitance of the capacitor 7 is small, owing to the small input capacitance thereof.

On the other hand, in the embodiment, the diode made of the nitride semiconductor can be used as the diode 3 connected to the FET 4. Since the diode of the nitride semiconductor provides the high breakdown voltage, it is suitable for a high-power circuit where a surge voltage is often induced, and thus it may make applicability of the embodiment wider. Further, since the diode of the nitride semiconductor has small capacitance, it can further heighten the principle advantage of the embodiment.

Further, a Schottky barrier diode made of a nitride semiconductor can be used as the diode 3 connected to the FET 4.

Since the Schottky barrier diode performs the rectifying operation with majority carriers, its response speed is very high. Thus, responsiveness with respective to a surge voltage can be further improved using the Schottky barrier diode. Further, although a silicon Schottky barrier diode has a breakdown voltage of appropriately 100 V, the Schottky barrier diode of the nitride semiconductor may sustain at least 2 kV. Therefore, using the nitride semiconductor widens the applicability of the embodiment.

Second Embodiment

Figure 3:
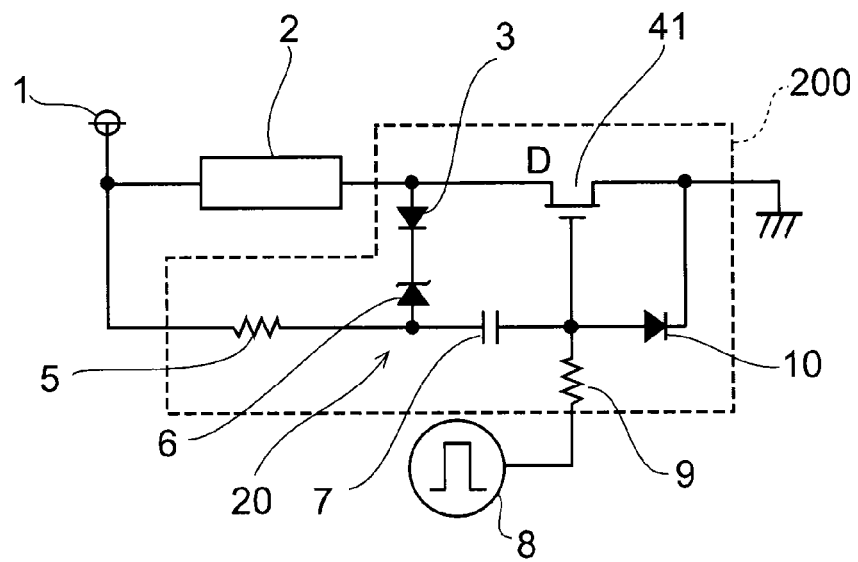
FIG. 3 is a schematic view illustrating an FET drive circuit according to a second embodiment.

FIG. 3 is a schematic view showing an FET drive circuit according to a second embodiment.

According to the embodiment, a normally on type FET 41 is provided in the FET drive circuit 200, where the connection of the diode 10 is reversed.

The normally on type nitride semiconductor FET is more advantageous in low resistance, low cost and high reliability than normally off type one. The low resistance means an advantage such that the parasitic capacitance becomes small, because a chip area becomes small in a case where the resistor element is manufactured with same size as the normally off type one. Thus, the advantage of using the nitride semiconductor FET is more remarkable in the normally on type nitride semiconductor FET. The advantages of the low cost and high reliability are also important practically.

The normally on type FET is generally vulnerable, when a gate voltage is excessively applied to a positive side. Therefore, the connection of the diode 10 is reversed in the embodiment in order to protect the FET 4 against the positive-side voltage.

Third Embodiment

Figure 4:
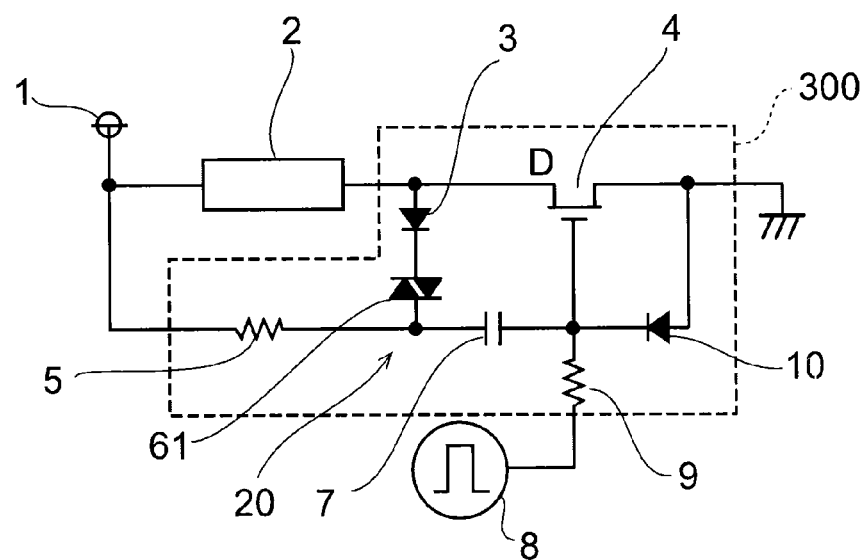
FIG. 4 is a schematic view illustrating an FET drive circuit according to a third embodiment.

FIG. 4 is a schematic view showing an FET drive circuit according to a third embodiment.

In the FET drive circuit 300 of the embodiment, a trigger diode 61 is provided replacing the zener diode 6 in the FET drive circuit described in the first and second embodiments.

When a predetermined voltage is applied, an electric current starts to flow in the trigger diode like the zener diode, but when the electric current once starts to flow, the voltage between both ends of the trigger diode become lower than the predetermined voltage.

In the case where a surge voltage applied to the drain of the FET 4 gently rises, a voltage applied to the trigger diode 61 up to that time decreases precipitously, when a surge voltage reaches at not less than a trigger voltage. Thus, even when a surge voltage gently rises, namely the drain voltage is close to a direct current, a precipitous voltage change can be imposed on the capacitor 7. Thereby, the gate voltage of the FET 4 is raised, and a surge current can be released via the FET 4. That is, even when a surge voltage varies slowly, it can be sensitively detected at the trigger diode 61, so that the FET 4 can be protected.

Fourth Embodiment

Figure 5:
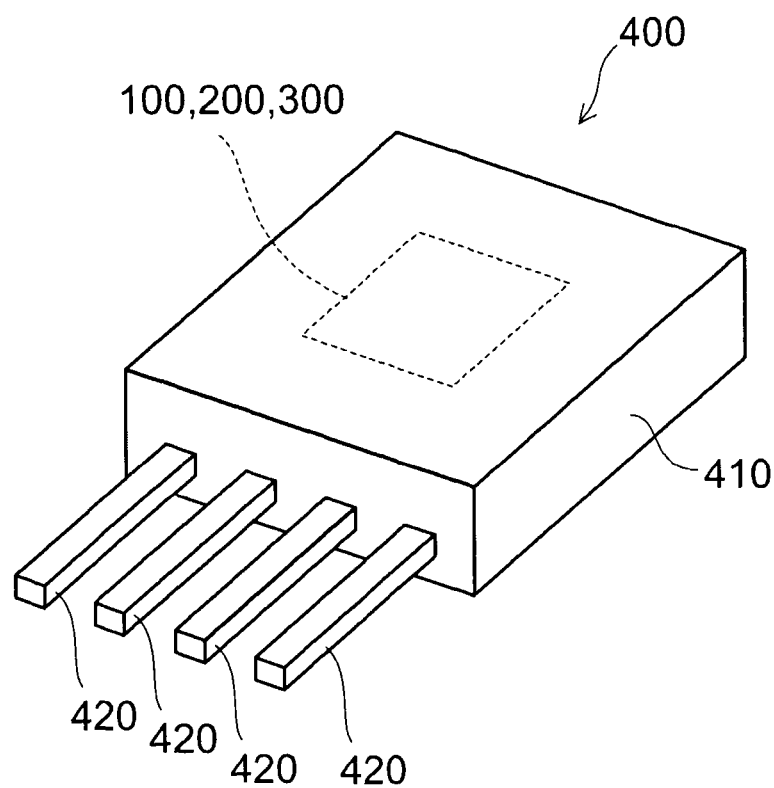
FIG. 5 is a schematic perspective view showing an FET module according to a fourth embodiment.

FIG. 5 is a schematic perspective view showing an FET module according to a fourth embodiment.

Figure 6:
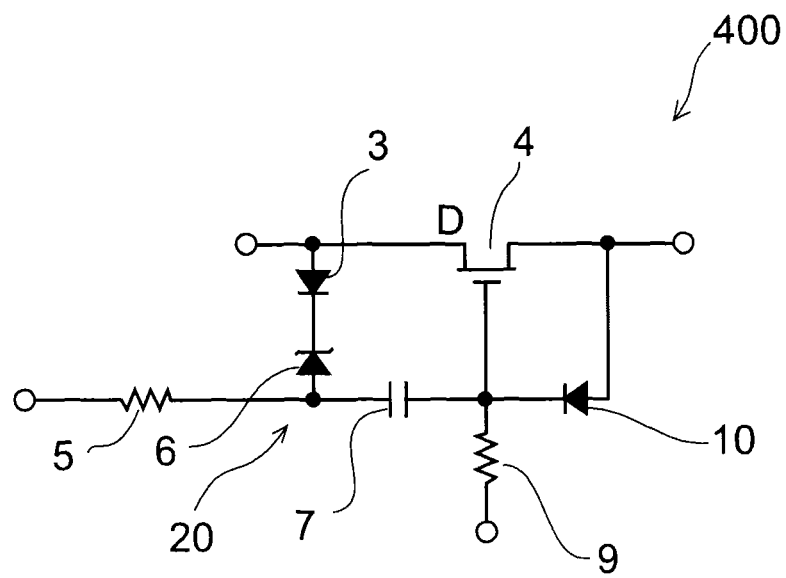
FIG. 6 is a schematic view showing the FET drive circuit provided to the FET module.

FIG. 6 is a schematic view showing an FET drive circuit provided to the FET module.

That is, the FET module 400 shown in FIG. 6 includes the FET drive circuit according to the first embodiment. It is also possible to include the FET drive circuit shown in the second or third embodiment.

The components, such as the FET 4, the diode 3, the zener diode 6, the capacitor 7, the resistor 5, the gate resistor 9, and the diode 10 of the FET drive circuit may be formed as individual components, or may be formed monolithically on the same substrate.

The FET drive circuit is accommodated in, for example, a resin or ceramic package 410, and can be connected to an external circuit via a lead 420 exposed on a surface of the package 410. Shape of the package 410 and number of the lead 420 are not limited to those shown in the drawings.

Since modularization reduces parasitic inductance, the surge generation may be fundamentally reduced. The FET 4 may be switched to the conductive state without a delay at a time when inducing the surge voltage.

The embodiments are described above with reference to the specific examples. However, the embodiments are not limited to the examples. That is to say, the specific examples in which the designs are changed by a person skilled in the art are also included in the embodiments as long as they have the characteristics of the embodiments. The components of the above described specific examples, and their arrangements, materials conditions, shapes and sizes are not limited to illustrated ones and may be suitably changed.

The components of the above described embodiments can be combined if technically possible, and the combined components are included in the scope of the embodiments as long as they have the characteristics of the embodiments. It is understood that variations and modifications can be made by a person skilled in the art within the scope of the idea of the embodiment, and the variations and modifications are also included in the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An FET drive circuit, comprising:
    an FET,
    a first circuit including a first rectifying device, a second rectifying device and a capacitive element sequentially provided in series from a drain to a gate of the FET, the first rectifying device allowing a forward electric current flowing from the drain to the gate, and the second rectifying device having a predetermined breakdown voltage with respect to the electric current from the drain to the gate; and
    a resistor provided between a power supply and a connecting point of the second rectifying device and the capacitive element; and
    a third rectifying device provided between a source and a gate of the FET.

2. The FET drive circuit according to claim 1, wherein the FET is a normally-off type FET, and the third rectifying device allows a forward electric current flowing from the source to the gate.

3. The FET drive circuit according to claim 1, wherein the FET is a normally-on type FET, and the third rectifying device allows a forward electric current flowing from the gate to the source.

4. The FET drive circuit according to claim 1, wherein the FET is a nitride semiconductor FET.

5. The FET drive circuit according to claim 4, wherein the FET includes a first layer, and a second layer which is provided on the first layer and has a band gap wider than the first layer.

6. The FET drive circuit according to claim 1, wherein the second rectifying device is a zener diode.

7. The FET drive circuit according to claim 1, wherein the second rectifying device is a trigger diode.

8. The FET drive circuit according to claim 1, wherein the first rectifying device is a nitride semiconductor diode.

9. The FET drive circuit according to claim 8, wherein the nitride semiconductor diode is a Schottky barrier diode.

10. The FET drive circuit according to claim 1, wherein each current capacity of the first rectifying device, the second rectifying device and the third rectifying device is smaller than a current capacity of the FET.

11. The FET drive circuit according to claim 1, wherein a load is provided between the drain of the FET and the power supply.

12. The FET drive circuit according to claim 1, wherein a breakdown voltage of the first rectifying device is higher than a voltage of the power supply.

13. The FET drive circuit according to claim 1, wherein the resistor is not less than 100 Ω.

14. The FET drive circuit according to claim 1, wherein a capacitance of the capacitive element is larger than each parasitic capacitance of the first rectifying device and the second rectifying device.

15. An FET module, comprising:
an FET drive circuit comprising:
  an FET,
  a first circuit including a first rectifying device, a second rectifying device and a capacitive element sequentially provided in series from a drain to a gate of the FET, the first rectifying device allowing a forward electric current flowing from the drain to the gate, the second rectifying device having a predetermined breakdown voltage with respect to the electric current flowing from the drain to the gate,
  a resistor connected between a power source and a connecting point of the second rectifying device and the capacitive element, and
  a third rectifying device provided between a source and a gate of the FET;
a package for accommodating the FET drive circuit; and
a lead connected to the FET drive circuit and exposed on a surface of the package.

16. The FET module according to claim 15, wherein
the FET is a normally-off type FET, and
the third rectifying device allows a forward electric current flowing from the source to the gate.

17. The FET module according to claim 15, wherein
the FET is a normally-on type FET, and
the third rectifying device allows a forward electric current flowing from the gate to the source.

18. The FET module according to claim 15, wherein the second rectifying device is a zener diode.

19. The FET module according to claim 15, wherein the second rectifying device is a trigger diode.

20. The FET module according to claim 15, wherein the FET, the first rectifying device, the second rectifying device, the capacitive element and the resistor are provided on one substrate.

* * * * *